(12) United States Patent
Klick

(10) Patent No.: US 7,827,638 B1
(45) Date of Patent: Nov. 9, 2010

(54) MULTI-FUNCTION TOOL AND BATTERY TESTER DEVICE

(75) Inventor: Robert Jerome Klick, 2445 Orkla Dr., Golden Valley, MN (US) 55427

(73) Assignee: Robert Jerome Klick, Golden Valley, MN (US)

( * ) Notice: Subject to any disclaimer, the term of this patent is extended or adjusted under 35 U.S.C. 154(b) by 85 days.

(21) Appl. No.: 12/228,306

(22) Filed: Aug. 12, 2008

Related U.S. Application Data

(60) Provisional application No. 61/066,429, filed on Feb. 20, 2008.

(51) Int. Cl.
*B26B 13/22* (2006.01)
*G01R 31/36* (2006.01)

(52) U.S. Cl. .............................................. 7/163; 7/127

(58) Field of Classification Search ..................... 7/127, 7/163
See application file for complete search history.

(56) References Cited

U.S. PATENT DOCUMENTS

| | | | | |
|---|---|---|---|---|
| 4,736,480 A * | 4/1988 | Bohl et al. | ...................... | 7/107 |
| 5,652,587 A * | 7/1997 | Liu | ............................. | 341/176 |
| 6,684,439 B2 * | 2/2004 | Jeske et al. | .................... | 7/107 |
| 6,848,139 B2 * | 2/2005 | Simon et al. | ................... | 7/127 |
| 7,468,674 B2 * | 12/2008 | Onachilla et al. | ........... | 340/660 |

* cited by examiner

*Primary Examiner*—David B Thomas

(57) ABSTRACT

A multi-function tool with a battery tester. The multi-function tool has a scissors-like cutter and a ceramic tool for scoring thin plastic wrap, such as cellophane type wrap. The battery tester can test a variety of battery types and voltages, especially 9 volt and 1.5 volt batteries due to distinct terminal pair arrangements carried on one or both handles.

10 Claims, 7 Drawing Sheets

MULTI-FUNCTION TOOL AND BATTERY TESTER DEVICE

CROSS REFERENCES TO RELATED APPLICATIONS

This application claims priority from provisional application 61/066,429 filed Feb. 20, 2008.

BACKGROUND OF THE INVENTION

1. Field of the Invention

The present invention is for a multi-function tool and battery tester device, and more particularly, pertains to a multi-function tool for opening plastic container covers, especially about battery powered devices, such as holiday toys, and testing batteries for use in powering such battery powered devices and holiday toys.

2. Description of the Prior Art

Various cutting and slicing and scoring devices have been previously known and are often used for opening packaging. At holiday celebrations, children and their parents frequently open packaging to reveal gifts such as toys. Clamshell type packaging is often a particularly difficult problem. Too often, the packaging is more robust than expected and shearing or cutting tools must be employed to reveal the toy. Often times these newly opened toys are battery powered. Unfortunately, a household battery shortage quickly develops during holiday celebrations. In conjunction with the task of opening toy packages, batteries need to be tested for adequate capacity so that the new toys may be reliably powered. Often times, harried parents can't find a battery tester and spend too much of the time swapping out dead and dying batteries from the new toys.

It would be highly desirable to combine opening tools, in a multi-function tool form, with a conveniently arranged battery tester. The present invention provides a

| PARTS LIST | |
|---|---|
| 20 | multi-function tool and battery tester device |
| 22 | first elongate member |
| 24 | second elongate member |
| 26 | pivot joint |
| 28 | first handle grip |
| 30 | rear end (first elongate member) |
| 32 | first cutting element |
| 34 | first blade |
| 36 | cutting edge |
| 38 | front end (first elongate member) |
| 40 | first arm segment |
| 42 | second handle grip |
| 44 | rear end (second elongate member) |
| 46 | second cutting element |
| 48 | second blade |
| 50 | cutting edge |
| 51 | front end (second elongate member) |
| 52 | second arm segment |
| 54 | connector |
| 60 | battery tester |
| 62 | 9 volt battery (ghost outline) |
| 64 | 1.5 volt battery (ghost outline) |
| 66 | 9 volt terminal (negative) |
| 68 | 9 volt terminal (positive) |
| 70 | green LED |
| 72 | red LED |
| 74 | yellow LED |
| 76 | (first) 1.5 volt terminal |
| 78 | (second) 1.5 volt terminal |
| 80 | spring |

-continued

| PARTS LIST | |
|---|---|
| 82 | slide lock |
| 84 | slide lick receiver |
| 86 | ceramic cutter / scoring blade |
| 88 | Phillips head screw driver |
| 89 | pivot (for screw driver) |
| 90 | circuit board | multi-function tool including both packaging opening tools and a battery tester. At a holiday celebration, one of the present invention devices could easily turn into a celebration saver for a harried parent with multiple children opening many plastic packed electronic toys.

The convenience of the present invention is enhanced by an ability to test batteries of different configurations and voltages. Additionally, the ability to score thin plastic wrap, such as cellophane, on CD and DVD packages is provided by the present invention.

SUMMARY OF THE INVENTION

The general purpose of the present invention is to provide a multi-function tool and battery tester.

According to the present invention, a multi-function tool is provided which includes first and second opposed elongate members joined together for scissor action about a pivot joint. The first elongate member has a first handle grip at a rear end and a first cutting element having a first blade with a cutting edge at a front end thereof, and a first arm segment intermediate the handle grip and blade. The second elongate member has a second handle grip at a rear end and a second cutting element having a second blade with a cutting edge at a front end thereof and a second arm segment intermediate the handle grip and blade. The first and second arm segments are joined by a connector to form the pivot joint. A means to measure battery condition is carried in the handle grip of the first elongate member. The means to measure battery condition includes a voltage testing circuit carried in the handle grip of the first elongate member, which voltage testing circuit measures and indicates voltage of a battery connected thereto. The indication of the measured voltage is preferably a visual indication of voltage of a battery connected thereto. Most preferably, the visual indication includes at least one LED, which at least one LED is illuminated by acceptable battery voltage. More preferably, additional LEDs may indicate other unacceptable or marginal battery voltages. Alternatively, though less desirably, other visual indicators such as incandescent bulbs, meters, and LCD screens might be employed. Preferably, the handle of the first elongate member further includes terminals for testing connection to a battery to assess the battery condition. Preferably, the terminals are a pair of terminals spaced to connect to a 9.0 volt type household battery. More preferably, the handle grip of the first elongate member also includes a first terminal for testing connection to a battery to assess the battery condition and the handle grip of the second elongate member includes a second terminal for testing connection to the battery to assess the battery condition and further wherein the separation spacing between the first terminal and the second terminal is adjustable by pivoting the first elongate member relative to the second elongate member about the pivot joint thereby accommodating a range of lengths of battery terminal separation between the first terminal on the first handle grip and the second terminal on the second handle grip. The multi-function tool also includes means urging the first elongate member to pivot about the pivot joint relative to the second elongate member such that the cutting blades are moved from a closed condition to an open condition. Preferably, this means is a spring. Additionally, the multi-function tool also includes means to limit pivoting about the pivot joint to pivoting between a substantially open condition and a substantially closed condition. Additionally, the tool preferably includes means to lock the first and second elongate members in a substantially closed condition. Preferably, the multi-function tool also includes a Phillips screwdriver head deployably connected to one of the elongate members of the multi-function tool. Preferably, a ceramic cutter or scoring blade is present, most preferably at the rear end of one of the handle grips. Preferably, the handle grips are asymmetrically shaped.

Alternatively, the present invention of a multi-function tool may be understood as including first and second opposed elongate members pivotally joined together about a pivot joint, where the first elongate member has a first handle grip at a rear end and a first arm segment extending from the handle grip. The second elongate member has a second handle grip at a rear end and a second arm segment extending from the handle grip. The first and second arm segments are joined by a connector to form the pivot joint. Also present is a means to measure battery condition carried in the handle grip of the first elongate member. The means to measure battery condition includes a voltage measuring and indication circuit. The means to measure further includes a first terminal pair for connecting a first battery type to the voltage measuring and indication circuit, the first terminal pair being located on an elongate member of the multi-function tool, and, a second terminal pair for connecting a second battery type to the voltage measuring and indication circuit, the second battery type characterized by a plurality of distinct terminal spacings. The second terminal pair has a terminal of the second terminal pair on the first elongate member and another terminal of the second terminal pair on the second elongate member, such that the second terminal pair has adjustable spacing to allow connection to at least two distinct terminal spacings of the second battery type by pivoting the first and second elongate members about the pivot joint. Preferably, a packaging cutting arrangement is present is provided at the front ends of the first and second opposed elongate members. Also one or more of the following may be present: a Phillips screwdriver head, a slotted screwdriver head, a knife, a scissor, a pliers, an adjustable wrench, a socket, an Allen head driver, and a ceramic cutter or scoring blade for scoring thin plastic wrap, such as cellophane.

The present invention may also be understood as a multi-function tool including first and second opposed elongate members joined together for scissor action about a pivot joint. The first elongate member has a first handle grip at a rear end and a first cutting element has a first blade with a cutting edge at a front end thereof and a first arm segment intermediate the handle grip and blade. The second elongate member has a second handle grip at a rear end and a second cutting element has a second blade with a cutting edge at a front end thereof and a second arm segment intermediate the handle grip and blade, and the first and second arm segments being joined by a connector to form the pivot joint. Also present is a means urging the first elongate member to pivot about the pivot joint relative to the second elongate member such that the cutting blades are moved from a closed condition to an open condition and means to limit pivoting about the pivot joint to pivoting substantially between the open condition and the closed condition and means to lock the first and second elongate members in a substantially closed condition and means to measure battery condition carried in the handle grip of the first elongate member. The means to measure include a voltage testing circuit carried in the handle grip of the first elongate member, which voltage testing circuit measures and visually indicates battery condition of 9.0 volt and 1.5 volt batteries connected thereto, wherein the visual indication includes a first LED which is illuminated by acceptable battery voltages, a second LED which is illuminated by marginal battery voltages and a third LED which is illuminated by unacceptable battery voltages, a 9.0 volt terminal pair for connecting 9.0 volt batteries to the voltage measuring and indication circuit, the 9.0 volt terminal pair being located on a single elongate member of the multi-function tool, and, a 1.5 volt terminal pair for connecting 1.5 volt batteries to the voltage measuring and indication circuit, the 1.5 volt batteries including AAA, AA, C, and D 1.5 volt batteries which are characterized by a plurality of distinct terminal spacings or lengths, the 1.5 volt terminal pair having a terminal of the 1.5 volt terminal pair on the first elongate member and another terminal of the 1.5 volt terminal pair on the second elongate member, such that the second terminal pair has adjustable spacing to allow connection to AAA, AA, C, and D 1.5 volt batteries by urging the pivoting of the first and second elongate members about the pivot joint by squeezing both handle grips toward each other to bring the second terminal pair into testing contact therewith.

According to one or more embodiments of the present invention, there is provided a multi-function tool with battery tester.

Having thus mentioned certain significant aspects and features of the present invention, it is the principal object of the present invention to provide a multi-function tool with battery tester.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein.

DETAILED DESCRIPTION OF THE PREFERRED EMBODIMENTS

Figure 1:
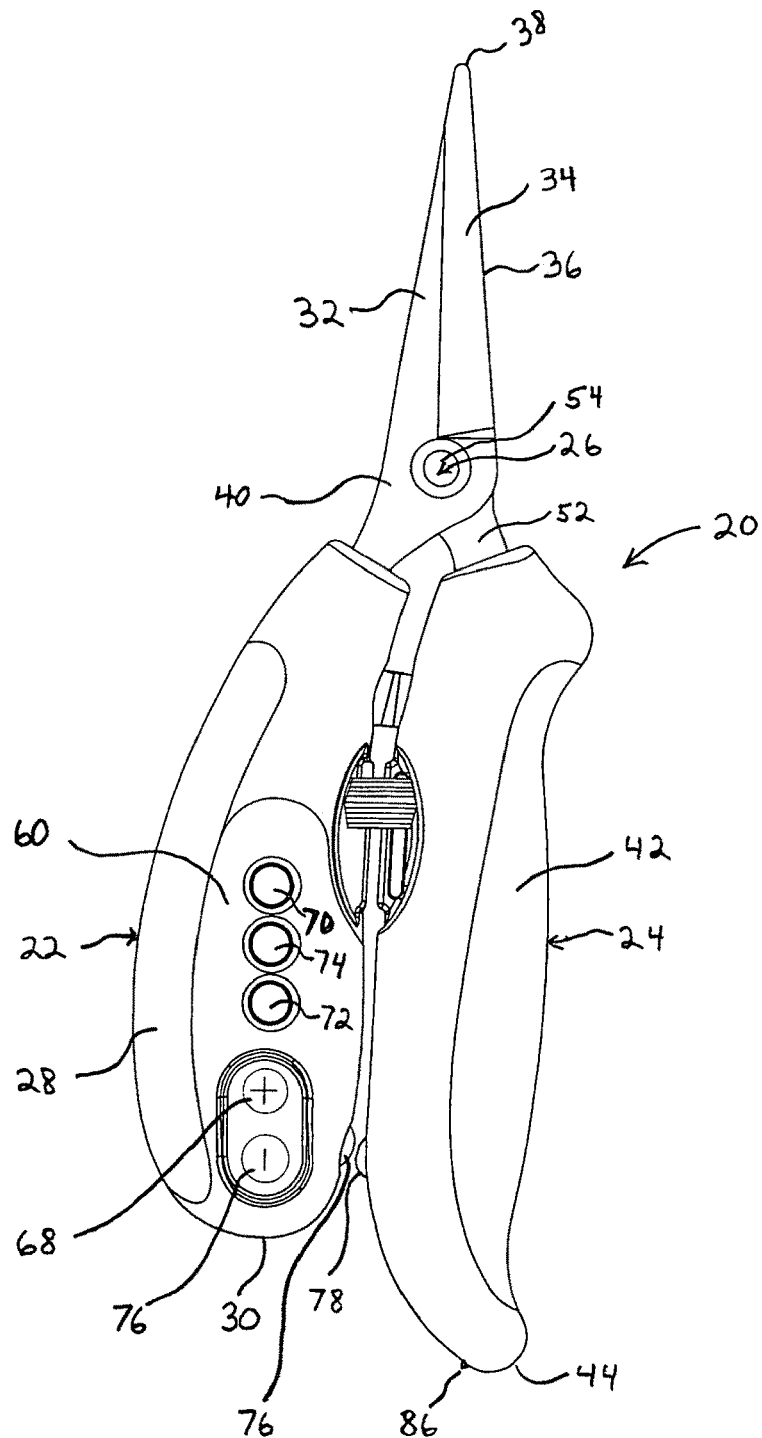
FIG. 1 is a front view of the present invention.
Figure 2:
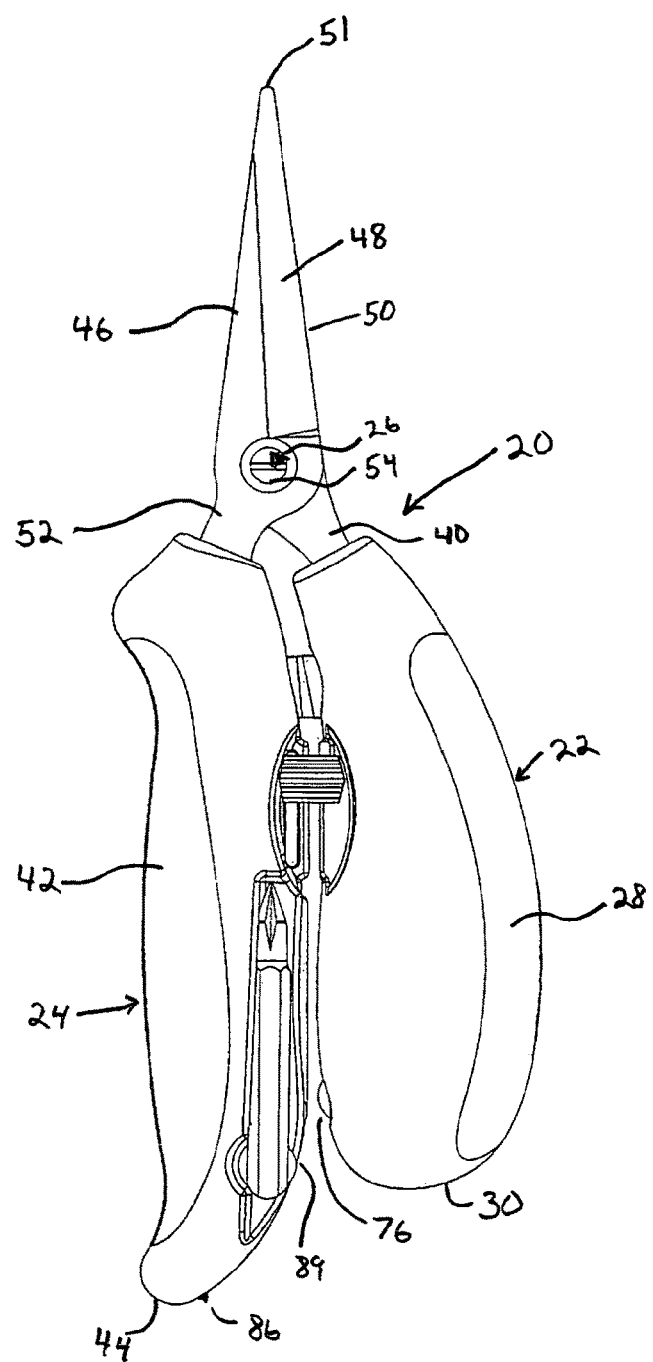
FIG. 2 is a rear view of the present invention shown in FIG. 1.
Figure 3:
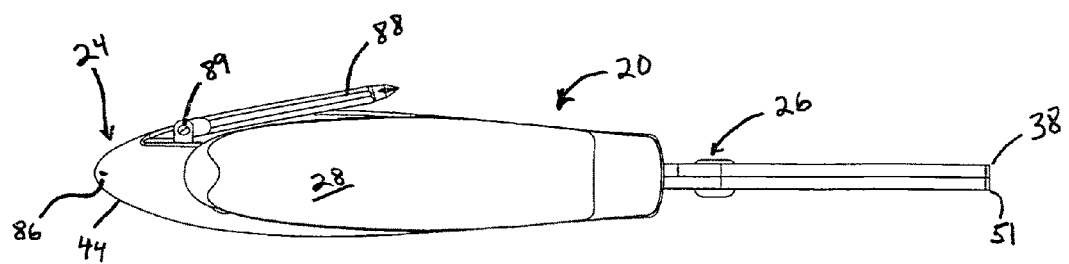
FIG. 3 is a bottom view of FIG. 1 when the invention is in a closed position.
Figure 4:
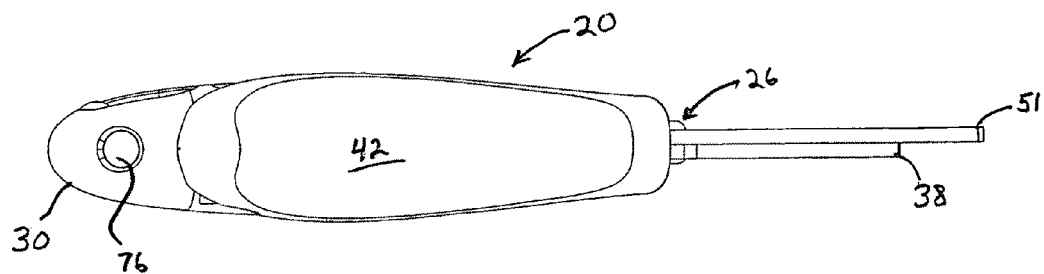
FIG. 4 is a bottom view of FIG. 1 when the invention is in an open position.

A multi-function tool and battery tester device, the present invention, is shown at 20 in FIGS. 1 and 2. The multi-function tool and battery tester device 20 includes first elongate member 22 and second elongate member 24 joined together for scissor action about a pivot joint 26. The first elongate member 22 has a first handle grip 28 at a rear end 30 and a first cutting element 32 having a first blade 34 with a cutting edge 36 at front end 38 and a first arm segment 40 intermediate the handle grip 28 and the first blade 34. The second elongate member 24 has a second handle grip 42 at a rear end 44 and a second cutting element 46 having a second blade 48 with a cutting edge 50 and a second arm segment 52 intermediate the handle grip 42 and the second blade 48. The first and second arm segments 40 and 52 are joined by a connector 54 to form pivot joint 26. A scissors action is provided between the cutting edges 36 and 50 as the device pivots between open and closed positions. Preferably, the front ends 38 and 51 allow the scissors action to initially pierce into clam-shell type packaging. Carried within the first handle grip 28 of first elongate member 22 is a battery tester 60 capable of measuring battery condition and enabling, assessment of battery condition. As shown in FIGS. 3 and 4, the cutting edges 36 and 50 move past each other as pivoting occurs about pivot joint 26, allowing plastic packaging, such as clam-shell packaging, to be easily cut open. In FIG. 3, front ends 38 and 51 are close together when the multi-function tool and battery tester 20 is in a closed position and separated, as shown in FIG. 4.

Figure 5:
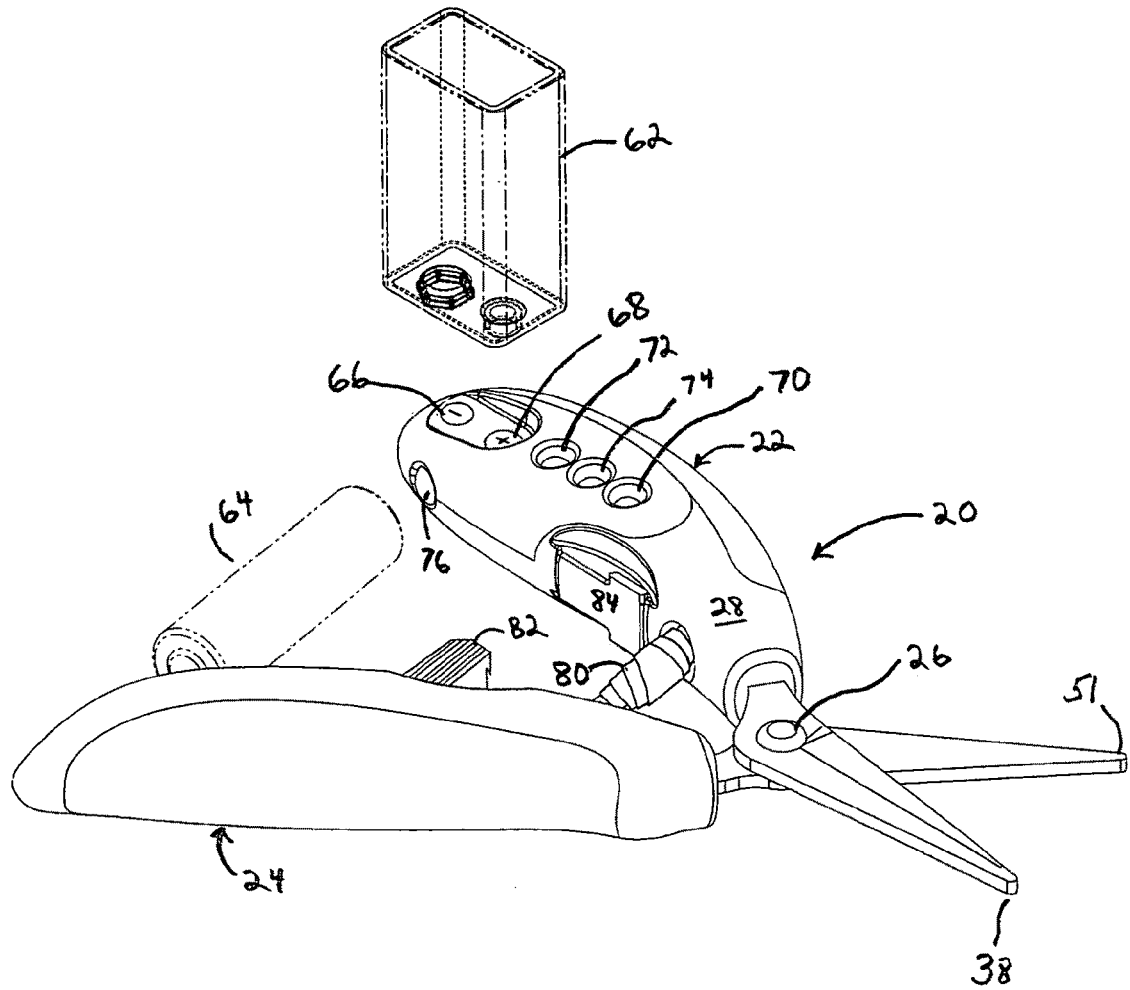
FIG. 5 shows an isometric view of the invention of FIG. 1.
Figure 6:
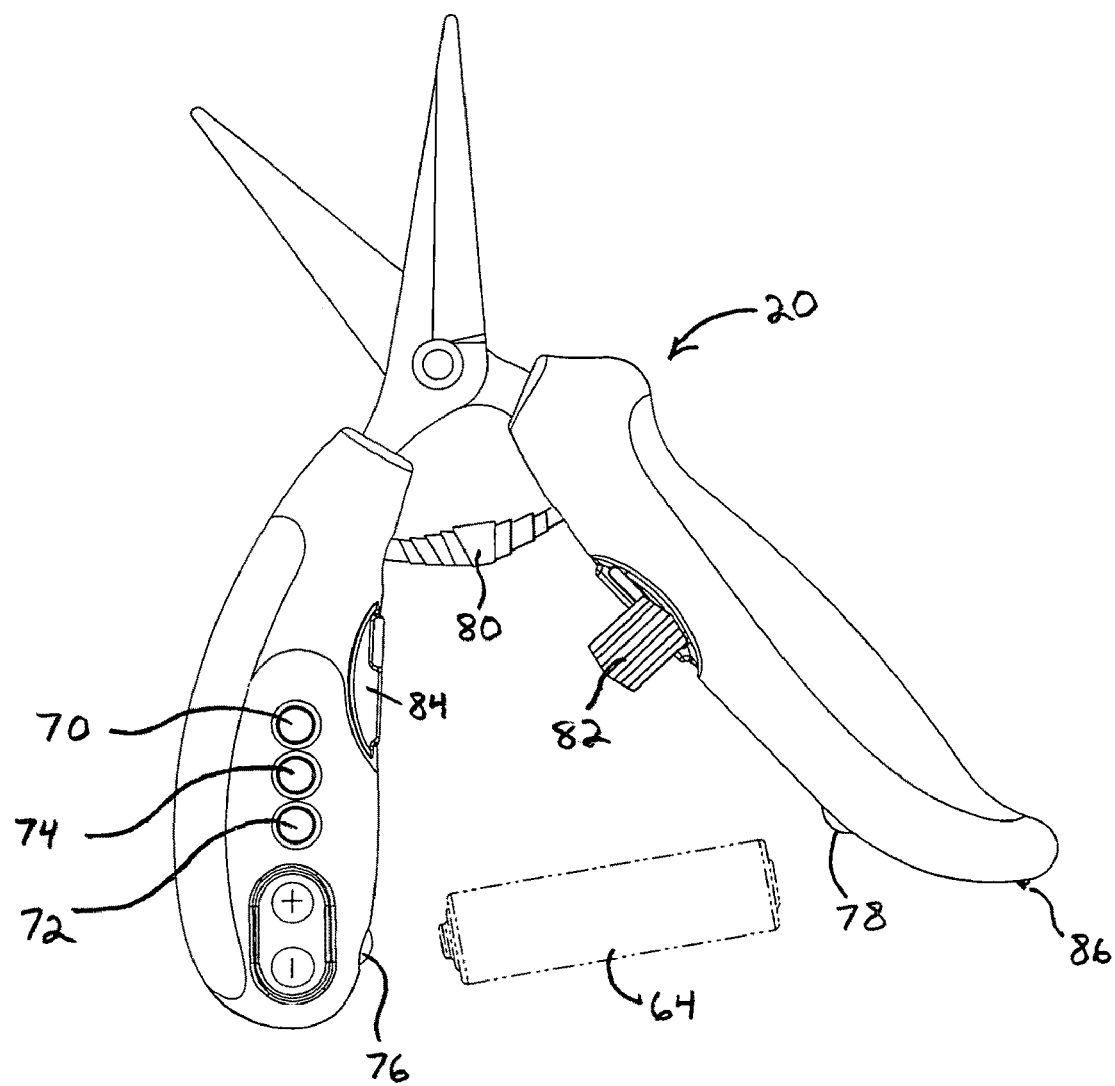
FIG. 6 shows the invention of FIG. 1 in an open condition and about to test a 1.5 volt battery.

The battery tester 60, carried in the first handle grip 28, measures voltage of a battery 62 or 64 temporarily connected thereto, as schematically illustrated in FIG. 5, where battery 62 is a 9 volt type battery (shown in ghost outline) generally oriented for testing and battery 64 is a 1.5 volt type battery (shown in ghost outline) generally oriented for testing. Preferably the multi-function tool and battery tester 20 can measure and assess the condition of both types of batteries 62 and 64. It should be noted that the assessments or measurements must be done one battery type at a time, since only one battery condition visualization system is present. With respect to 9 volt type batteries (shown in ghost outline at 62 of FIG. 5), appropriately spaced apart and sized terminals 66 and 68 are provided on the front side of the first handle grip 28. Preferably, terminal 66 fits the negative terminal of a 9 volt battery and terminal 68 fits the positive terminal of the 9 volt battery being tested. Visual indication of the battery condition is displayed with LEDs, and in particular, preferably, three LEDs are present, as follows: One LED 70 illuminating to indicate acceptable voltage, another LED 72 illuminating to indicate unacceptable voltage and a third LED 74 illuminating to indicate marginal voltage. Preferably, the acceptable LED 70 illuminates green, the unacceptable LED 72 illuminates red and the marginal LED 74 illuminates yellow. The inventor recognizes that other display systems might be employed, however, the red, green and intermediately situated yellow LEDs 70, 72, and 74, respectively, are reminiscent of a traffic light and thus, with particular regard to harried parents assisting children during a holiday celebration, easily understood and interpreted by harried parents without the need for reference to complex instructions. With respect to 1.5 volt batteries, a separate set of terminals 76 and 78 are provided. Terminal 76, preferably the positive 1.5 volt terminal, is situated on the lower rear of the first handle grip 28 and terminal 78, preferably the negative 1.5 volt terminal, is situated on the upper rear of the second handle grip 42. As the first elongate handle 22 is pivoted relative to the second elongate handle 24, the spacing between terminals 76 and 78 is altered, so as to accommodate different sizes of 1.5 volt batteries (as depicted in ghost outline at 64 in FIG. 6.) Additionally, a spring 80 is present between the handle grips 28 and 42 and resiliently urges the elongate members 22 and 24 toward an open condition. To measure a 1.5 volt battery, the battery to be tested is appropriately oriented and placed between the 1.5 volt terminals 76 and 78 and the first and second handle grips 28 and 42 urged together while observing the LEDs 70, 72, and 74. When the terminals 76 and 78 are both in contact with the terminal ends of the 1.5 volt battery, either the appropriate LED will indicate the battery condition (or alternatively, no LED will illuminate, indicating that the battery is entirely depleted and generally lacks voltage.) The 1.5 volt type batteries which may be tested with the present invention include AAA, AA, C, and D 1.5 volt batteries which are characterized by a plurality of distinct terminal spacings and related battery lengths. The position of the terminals 76 and 78 and the length and angle of the elongate members 22 and 24 at open position preferably are sufficient to accommodate such a range of battery lengths, and testing occurs by urging the pivoting of the first and second elongate members about the pivot joint by squeezing both handle grips toward each other to bring the second terminal pair into testing contact with the 1.5 volt type battery being tested. Preferably, a pivot stop is present, either within the spring 80 or the pivot joint 26, to prevent the uncontrolled pivoting of the elongate members past a useful open position.

Other components of the preferred embodiment of the multi-function tool and battery tester 20, include a slide lock 82 and slidelock receiver 84 to lock the elongate members 22 and 24 into closed condition. The slide lock 82 and slidelock receiver, when used to hold the tool in closed position, facilitate compact storage and promote safety. Additionally, a ceramic cutter 86 is present at the rear end 30 of the second elongate member 24 and is useful for scoring thin plastic or cellophane type wrapping such as found on new CD and DVD packages. Additionally, a screw driver head 88 is present and mounted by a pivot 89 on the second handle grip 42. The screw driver head 88 is preferably a Philips style driver head which is useful for opening battery compartment covers on many electronic toys. Alternatively, additional useful tools may be included on the multi-function tool and fulfill other functions, for example, tool functions selected from the group consisting of other sized Phillips screwdriver heads, slotted screwdriver heads, knives, scissors, pliers, adjustable wrenches, sockets, Allen head drivers, and additional ceramic cutters for scoring thicker plastic wrap.

Figure 7:
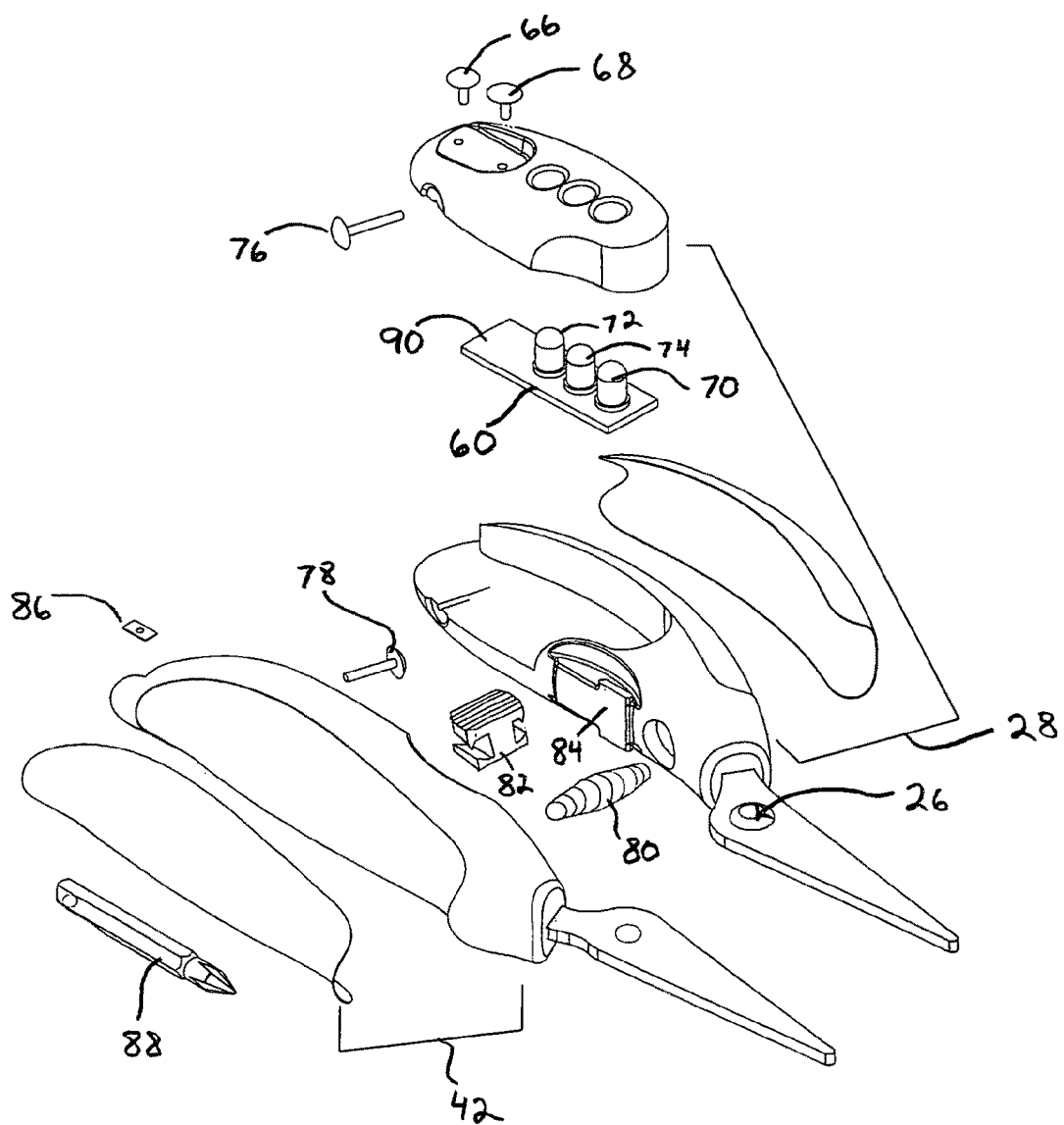
FIG. 7 illustrates an exploded view of FIG. 5.

FIG. 7 schematically shows an exploded view of the components of the multi-function tool and battery tester 20, including three-part handle grip 28 and two part handle grip 42. Preferably, the several parts of each handle grip 28 and 42 are distinctly colored to enhance the appearance of the preferred embodiment and make it readily visible amidst the confusion of shredded holiday wrap. The preferred three LED 70, 72, and 74 indicators of the battery tester 60 are shown mounted on a circuit board 90, to be situated within and covered by a portion of the first handle grip 28 with apertures appropriately provided for viewing the LEDs 70, 72, and 74. Circuit boards carrying LEDs, terminals and connections and circuit designs illuminating the LEDs at appropriate pre-designated voltages are well within the skill of the art.

Figure 8:
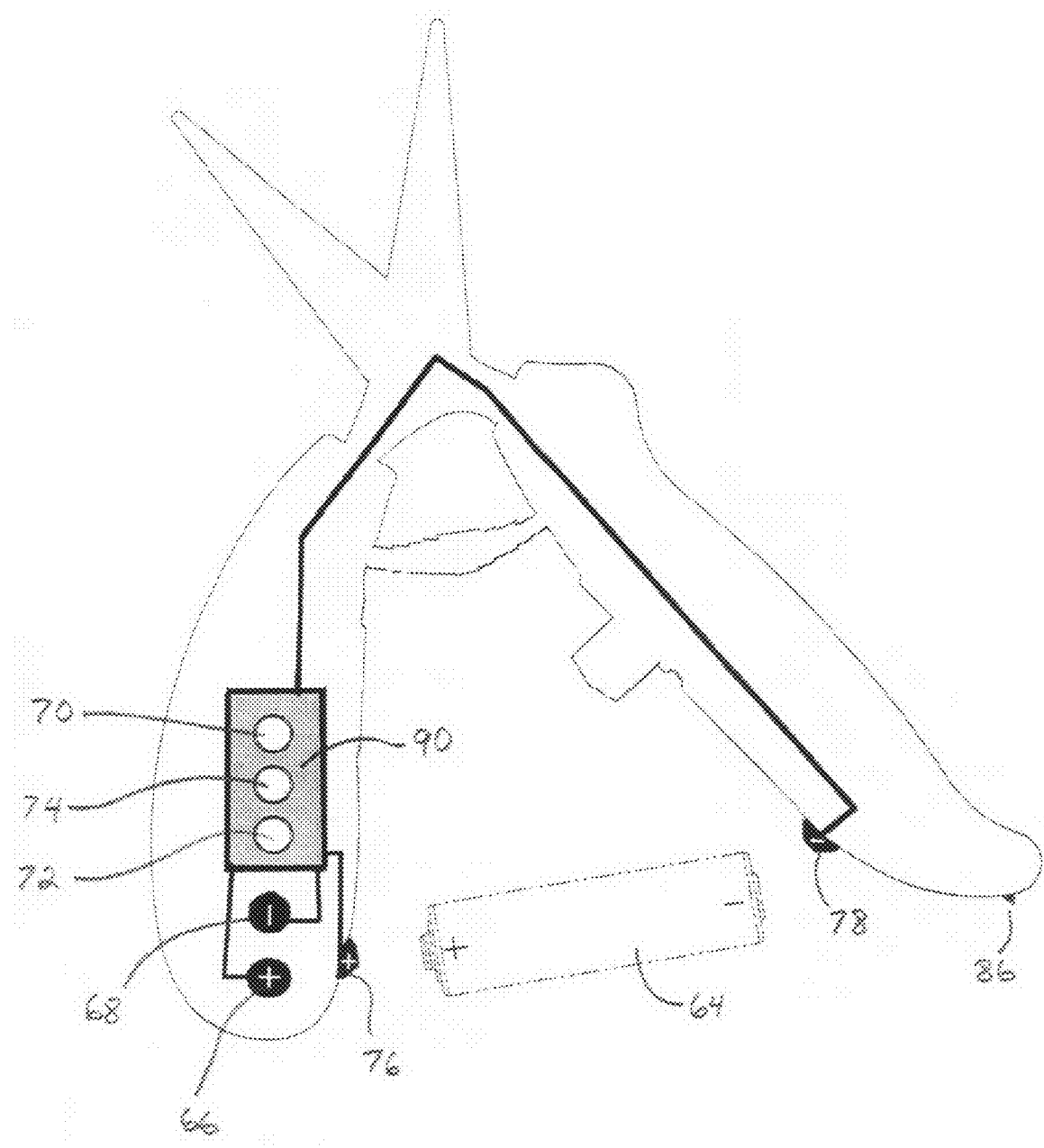
FIG. 8 illustrates schematically the dual battery testing capability of the invention of FIG. 1.

Terminals 66, 68, 76, and 78 are shown and a preferred electrical connection scheme is schematically depicted in FIG. 8. Note that the underlying metal of the first and second elongate members 22 and 24, and preferably a metallic conductive connector 54 of pivot joint 26 may serve to conduct current to the circuit board 90 bearing the LEDs 70, 72, and 74.

Various modifications can be made to the present invention without departing from the apparent scope thereof.

The invention claimed is:
1. A multi-function tool comprising:
first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint; and, means to measure battery condition carried in the handle grip of the first elongate member, wherein the means to measure battery condition includes a voltage testing circuit carried in the handle grip of the first elongate member, which voltage testing circuit measures and indicates voltage of a battery connected thereto, wherein the indication of the measured voltage is a visual indication of voltage of a battery connected thereto, and wherein the visual indication includes at least one LED, which at least one LED is illuminated by marginal battery voltage.

2. A multi-function tool comprising:

first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint; and, means to measure battery condition carried in the handle grip of the first elongate member, wherein the means to measure battery condition includes a voltage testing circuit carried in the handle grip of the first elongate member, which voltage testing circuit measures and indicates voltage of a battery connected thereto, wherein the indication of the measured voltage is a visual indication of voltage of a battery connected thereto and wherein the visual indication includes a first LED which is illuminated by acceptable battery voltage, a second LED which is illuminated by marginal battery voltage, and a third LED which is illuminated by unacceptable battery voltage.

3. A multi-function tool comprising:

first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint; and, means to measure battery condition carried in the handle grip of the first elongate member, wherein the means to measure battery condition includes a voltage testing circuit carried in the handle grip of the first elongate member, which voltage testing circuit measures and indicates voltage of a battery connected thereto; and wherein the handle of the first elongate member further includes terminals for connection to a battery to assess battery condition.

4. The multi-function tool of claim 3 and wherein the terminals are spaced and shaped to connect to a 9.0 volt type household battery.

5. A multi-function tool comprising:

first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint;

means to measure battery condition carried in the handle grip of the first elongate member, wherein the means to measure battery condition includes a voltage testing circuit carried in the handle grip of the first elongate member, which voltage testing circuit measures and indicates voltage of a battery connected thereto; and, wherein the handle grip of the first elongate member includes a first terminal for testing connection to a battery to assess the battery condition and the handle grip of the second elongate member includes a second terminal for testing connection to the battery to assess the battery condition and further wherein the separation spacing between the first terminal and the second terminal is adjustable by pivoting the first elongate member relative to the second elongate member about the pivot joint thereby accommodating a range of lengths of battery terminal separation between the first terminal on the first handle grip and the second terminal on the second handle grip.

6. A multi-function tool comprising:

first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint;

means to measure battery condition carried in the handle grip of the first elongate member; and, a Phillips screwdriver head deployably connected to one of the elongate members of the multi-function tool.

7. The multi-function tool of claim 6 and wherein the handle grips are asymmetrically shaped and at least one of the handle grips includes a ceramic cutter situated adjacent a rear end of the handle grip and adapted for scoring thin plastic wrap.

8. A multi-function tool comprising:

first and second opposed elongate members pivotally joined together about a pivot joint, the first elongate member having a first handle grip at a rear end and a first arm segment extending from the handle grip, the second elongate member having a second handle grip at a rear end and a second arm segment extending from the handle grip, and, the first and second arm segments being joined by a connector to form the pivot joint; and, means to measure battery condition carried in the handle grip of the first elongate member, wherein the means to measure battery condition include a voltage measuring and indication circuit, the means to measure further including:
- a first terminal pair for connecting a first battery type to the voltage measuring and indication circuit, the first terminal pair being located on an elongate member of the multi-function tool, and,
- a second terminal pair for connecting a second battery type to the voltage measuring and indication circuit, the second battery type characterized by a plurality of distinct terminal spacings, the second terminal pair having a terminal of the second terminal pair on the first elongate member and another terminal of the second terminal pair on the second elongate member, such that the second terminal pair has adjustable spacing to allow connection to at least two distinct terminal spacing of the second battery type by pivoting the first and second elongate members about the pivot joint.

9. The multi-function tool of claim 8 and wherein the multi-function tool further includes another tool function selected from the group consisting of Phillips screwdriver heads, slotted screwdriver heads, knives, scissors, pliers, adjustable wrenches, sockets, and Allen head drivers.

10. A multi-function tool comprising:
- first and second opposed elongate members joined together for scissor action about a pivot joint, the first elongate member having a first handle grip at a rear end and a first cutting element having a first blade with a cutting edge at a front end thereof and a first arm segment intermediate the handle grip and blade, and the second elongate member having a second handle grip at a rear end and a second cutting element having a second blade with a cutting edge at a front end thereof and a second arm segment intermediate the handle grip and blade, and the first and second arm segments being joined by a connector to form the pivot joint; and,
- means urging the first elongate member to pivot about the pivot joint relative to the second elongate member such that the cutting blades are moved from a closed condition to an open condition;
- means to limit pivoting about the pivot joint to pivoting substantially between the open condition and the closed condition;
- means to lock the first and second elongate members in a substantially closed condition;
- means to measure battery condition carried in the handle grip of the first elongate member, the means to measure including a voltage testing circuit carried in the handle grip of the first elongate member, which voltage testing circuit measures and visually indicates battery condition of 9.0 volt and 1.5 volt batteries connected thereto, wherein the visual indication includes a first LED which is illuminated by acceptable battery voltages, a second LED which is illuminated by marginal battery voltages and a third LED which is illuminated by unacceptable battery voltages, a 9.0 volt terminal pair for connecting 9.0 volt batteries to the voltage measuring and indication circuit, the 9.0 volt terminal pair being located on a single elongate member of the multi-function tool, and, a 1.5 volt terminal pair for connecting 1.5 volt batteries to the voltage measuring and indication circuit, the 1.5 volt batteries including AAA, AA, C, and D 1.5 volt batteries which are characterized by a plurality of distinct terminal spacings, the 1.5 volt terminal pair having a terminal of the 1.5 volt terminal pair on the first elongate member and another terminal of the 1.5 volt terminal pair on the second elongate member, such that the second terminal pair has adjustable spacing to allow connection to AAA, AA, C, and D 1.5 volt batteries by urging the pivoting of the first and second elongate members about the pivot joint by squeezing both handle grips toward each other to bring the second terminal pair into testing contact therewith.

\* \* \* \* \*